(12) United States Patent
Liu et al.

(10) Patent No.: US 12,155,351 B2
(45) Date of Patent: Nov. 26, 2024

(54) OSCILLATOR CIRCUIT, CHIP AND ELECTRONIC DEVICE

(71) Applicant: GigaDevice Semiconductor Inc., Beijing (CN)

(72) Inventors: Yunchao Liu, Beijing (CN); Sanlin Liu, Beijing (CN)

(73) Assignee: GigaDevice Semiconductor Inc., Beijing (CN)

( * ) Notice: Subject to any disclaimer, the term of this patent is extended or adjusted under 35 U.S.C. 154(b) by 0 days.

(21) Appl. No.: 18/124,859

(22) Filed: Mar. 22, 2023

(65) Prior Publication Data

US 2024/0007051 A1 Jan. 4, 2024

(30) Foreign Application Priority Data

Jun. 30, 2022 (CN) .......................... 202210770301.7

(51) Int. Cl.
*H03B 5/36* (2006.01)
*H03B 5/06* (2006.01)

(52) U.S. Cl.
CPC ............... *H03B 5/364* (2013.01); *H03B 5/06* (2013.01); *H03B 2200/0038* (2013.01)

(58) Field of Classification Search
CPC .......... H03B 5/06; H03B 5/362; H03B 5/364; H03B 2200/038; H03B 2200/0094
See application file for complete search history.

(56) References Cited

U.S. PATENT DOCUMENTS

| 6,278,338 B1* | 8/2001 | Jansson | H03B 5/364 331/109 |
| 9,054,637 B1* | 6/2015 | Mittal | H03B 5/04 |
| 2016/0181978 A1* | 6/2016 | Mittal | H03B 5/366 331/116 FE |

* cited by examiner

*Primary Examiner* — Jeffrey M Shin
(74) *Attorney, Agent, or Firm* — Thomas Horstemeyer, LLP

(57) ABSTRACT

An oscillator circuit is provided and includes first and second terminals; an amplification circuit with an input end and an out end coupled to a first end and a second end of a crystal circuit through the first terminal and the second terminal, respectively; a gain control circuit coupled to the amplification circuit and including a differential amplifier, a first current source, a feedback path and a current mirror, wherein: the differential amplifier includes first and second transistors, sources of the first and second transistors are coupled to the first current source; a gate of the first transistor is coupled to a first direct current voltage and coupled to the input end or the output end through the feedback path; a gate of the second transistor is coupled to a second direct current voltage; the current mirror mirrors a current flowing through the second transistor to the amplification circuit.

20 Claims, 4 Drawing Sheets

US 12,155,351 B2

OSCILLATOR CIRCUIT, CHIP AND ELECTRONIC DEVICE

CROSS-REFERENCE TO RELATED APPLICATIONS

The present application claims priority to Chinese Patent Application No. 202210770301.7 and filed Jun. 30, 2022, the entire contents of which are incorporated herein by reference.

TECHNICAL FIELD

The present disclosure relates to a field of electronic technology, and more particularly, to an oscillator circuit, a chip and an electronic device.

BACKGROUND

Crystal oscillators are high-accuracy clock reference widely used in electronic systems. In the related art, an operating point of the crystal oscillator is fixed, the crystal oscillator has a constant transconductance before and after a startup, and a stable operating frequency. However, a small bias current may easily cause that the crystal oscillator doesn't start an oscillation, while a large bias current may cause high power consumption. Due to changes of an external crystal parameter and an ambient temperature, an optimal direct current operating point corresponding to the crystal oscillator is different, and improper compromise easily leads to the crystal oscillator not oscillating or the high power consumption, which in turn causes the change of the operating point, thereby resulting in an unstable oscillation frequency of the crystal oscillator.

As mentioned above, it has become an urgent problem to be solved regarding how the crystal oscillator provides output signal with a stable oscillation frequency.

The above-mentioned information disclosed in the Background section is only used to enhance the understanding of the background of the present disclosure, and therefore it may include information that does not constitute the information of the related art known to those skilled in the art.

SUMMARY

The present disclosure aims to provide an oscillator circuit, a chip and an electronic device, which may at least improve the stability of the output signal provided by a crystal oscillator to a certain extent.

Other features and advantages of the present disclosure will be apparent from the following detailed description, or acquired in part by the practice of the present disclosure.

According to an aspect of the present disclosure, an oscillator circuit is provided and includes: a first terminal and a second terminal; an amplification circuit with an input end coupled to a first end of a crystal circuit through the first terminal and an output end coupled to a second end of the crystal circuit through the second terminal; a gain control circuit coupled to the amplification circuit and including a differential amplifier, a first current source, a feedback path and a current mirror, wherein: the differential amplifier includes a first transistor and a second transistor, a source of the first transistor and a source of the second transistor are coupled to the first current source; a gate of the first transistor is coupled to a first direct current voltage, and the gate of the first transistor is coupled to the input end or the output end of the amplification circuit through the feedback path; a gate of the second transistor is coupled to a second direct current voltage; the current mirror mirrors a current flowing through the second transistor to the amplification circuit.

According to another aspect of the present disclosure, an oscillator circuit is provided and includes: an amplification circuit, wherein an input end of the amplification circuit is coupled to a first end of an external crystal oscillator, and an output end of the amplification circuit is coupled to a second end of the external crystal oscillator; a differential amplifier, wherein the differential amplifier includes a first transistor and a second transistor, and the first transistor and the second transistor form a input pair transistor of the differential amplifier; a current mirror, wherein the current mirror includes a sixth transistor and a seventh transistor, the sixth transistor and the seventh transistor form a pair transistor of the current mirror, the sixth transistor is connected to the second transistor, the seventh transistor is connected to the output end of the amplification circuit, and the current mirror is configured to mirror a current flowing through the second transistor to the amplification circuit; wherein a gate of the first transistor is coupled to the input end or the output end of the amplification circuit through the first capacitor, during the external crystal oscillator starts oscillation, an oscillation amplitude of the input end or the output end of the amplification circuit increases gradually, a current flowing through the first transistor increases gradually, and a current flowing through the second transistor decreases gradually, a direct current mirrored to the amplification circuit decreases gradually until the crystal oscillator reaches a balanced state.

According to another aspect of the present disclosure, a chip is provided and includes the any one of above oscillator circuit.

It should be understood that the foregoing general description and the following detailed description are only illustrative and cannot limit the present disclosure.

BRIEF DESCRIPTION OF THE DRAWINGS

The above and other objectives, features, and advantages of the present disclosure will become more apparent from the detailed description of exemplary embodiments with reference to the accompanying drawings

DETAILED DESCRIPTION

Figure 1:
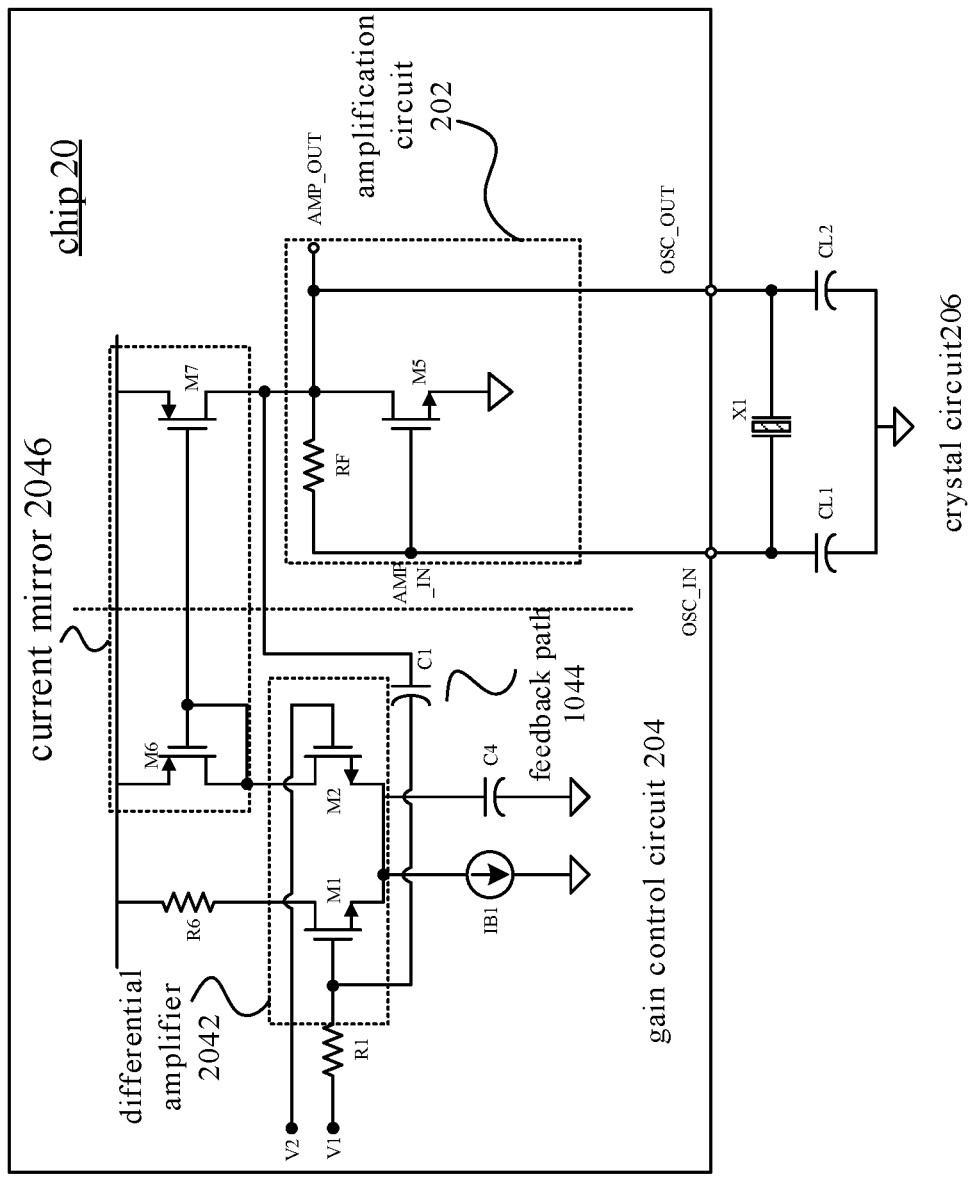
FIG. 1 shows a schematic diagram of an oscillator circuit in an embodiment of the present disclosure.

The exemplary embodiments will be fully described with reference to the drawings. However, the example embodiments may be implemented in various forms and should not be understood as limited to the examples described herein; on the contrary, these embodiments makes the present disclosure more comprehensive and complete, the concept of the exemplary embodiments is fully conveyed to those skilled in the art. The drawings are merely schematic illustrations of the present disclosure, and are not necessarily drawn to scale. Similar reference numerals in the drawings indicate the same or similar portions, with repeated description thereof omitted.

In addition, the described features, structures, or characteristics may be combined in any suitable manner in one or more embodiments. In the following description, numerous specific details are set forth to provide a thorough understanding of the embodiments of the disclosure. However, those skilled in the art will appreciate that the technical solution of the present disclosure may be practiced without one or more of the specific details, or employing other methods, apparatus, steps, and the like. In other instances, well-known technical solutions are not shown or described in detail to avoid obscuring aspects of the present disclosure.

In addition, terms such as "first" and "second" are used herein for purposes of description and are not intended to indicate or imply relative importance or significance or to imply the number of indicated technical features. Therefore, features limited by "first" and "second" may indicate explicitly or implicitly that one or more features are included. In the description of the present disclosure, unless otherwise specifically limited, "a plurality" means at least two, for example, two or three. The character "I" generally indicates an "or" relationship between the associated objects.

In the present disclosure, unless otherwise clearly specified and limited, terms such as "connect" should be understood in a generalized manner, for example, may be understood as electrical connection, or mutual communication, or may be understood as direct connection, or indirect connection with a medium. A person of ordinary skill in the art may understand specific meanings of the terms in the present disclosure according to specific situations.

The present disclosure provides an oscillator circuit, which detects an oscillation amplitude of an input end or an output end of an amplification circuit through a gain control circuit, adjusts an operating current of the amplification circuit by a negative feedback, and limits the oscillation amplitude of the input end of the amplification circuit, so as to maintain the oscillation amplitude at a level of just oscillation, while a fixed oscillation amplitude reduces an influence of nonlinearity of the amplification circuit on a frequency, thus ensuring a stable switching of an operating point of a crystal circuit and a stable output frequency.

FIG. 1 is a schematic diagram of an oscillator circuit shown according to an exemplary embodiment. For example, the oscillator circuit shown in FIG. 1 may be provided on a chip 20. The chip 20 may be, for example, a microcontroller unit (MCU), a central processing unit (CPU), a system on chip (SoC) or other chips, and coupled to an off-chip crystal oscillator through a chip pin. Both the crystal oscillator and the chip 20 may be mounted on a printed circuit board (PCB) (not shown in FIG. 1). The oscillator circuit on the chip 20 may include: a first terminal OSC_IN, a second terminal OSC_OUT, an amplification circuit 202, and a gain control circuit 204.

An input end AMP_IN of the amplification circuit 202 is coupled to a first end of the crystal circuit 206 through the first terminal OSC_IN, and an output end AMP_OUT of the amplification circuit 202 is coupled to a second end of the crystal circuit through the second terminal OSC_OUT.

In some embodiments, the amplification circuit 202 may include a fifth transistor M5 and a feedback resistor RF, and a gate of the fifth transistor M5 serves as the input end AMP_IN of the amplification circuit 202, a drain of the fifth transistor M5 serves as the output end AMP_OUT of the amplification circuit 202. The fifth transistor M5 operates in a saturation region as a single transistor amplifier. The feedback resistor RF may be provided between the input end AMP_IN of the amplification circuit 202 and output end AMP_OUT of the amplification circuit 202, and that is, the feedback resistor is provided between the first terminal and the second terminal. In other embodiments, the amplification circuit 202 may also adopt an inverted amplifier as an amplification element or other circuit, which is not limited herein.

In some embodiments, the crystal circuit 206 may include a crystal X1, a first load capacitor CL1, and a second load capacitor CL2. The crystal circuit 206 may be considered as a schematic circuit of the crystal oscillator, and the crystal oscillator may also be referred to as a crystal resonator.

The gain control circuit 204 may include a differential amplifier 2042, a first current source IB1, a feedback path 1044, and a current mirror 2046. The gain control circuit 204 is coupled to the amplification circuit 202 through the current mirror 2046.

The differential amplifier 2042 may include a first transistor M1 and a second transistor M2, and a source of the first transistor M1 and a source of the second transistor M2 are coupled to the first current source IB1.

In the embodiment of FIG. 1, a gate of the first transistor M1 is coupled to a first direct current voltage V1, and the gate of the first transistor M1 is also coupled to the output end AMP_OUT of the amplification circuit 202 through the feedback path 1044, so as to detect the oscillation amplitude of the output end AMP_OUT of the amplification circuit 202. The feedback path 1044 may include a first capacitor C1, and the feedback path 1044 is coupled to AMP_OUT, OSC_OUT and the crystal oscillator through the C1. The feedback path 1044 enables the crystal oscillator to start the oscillation and stably enter to a balanced state through a negative feedback adjustment of the first capacitor C1.

Figure 2:
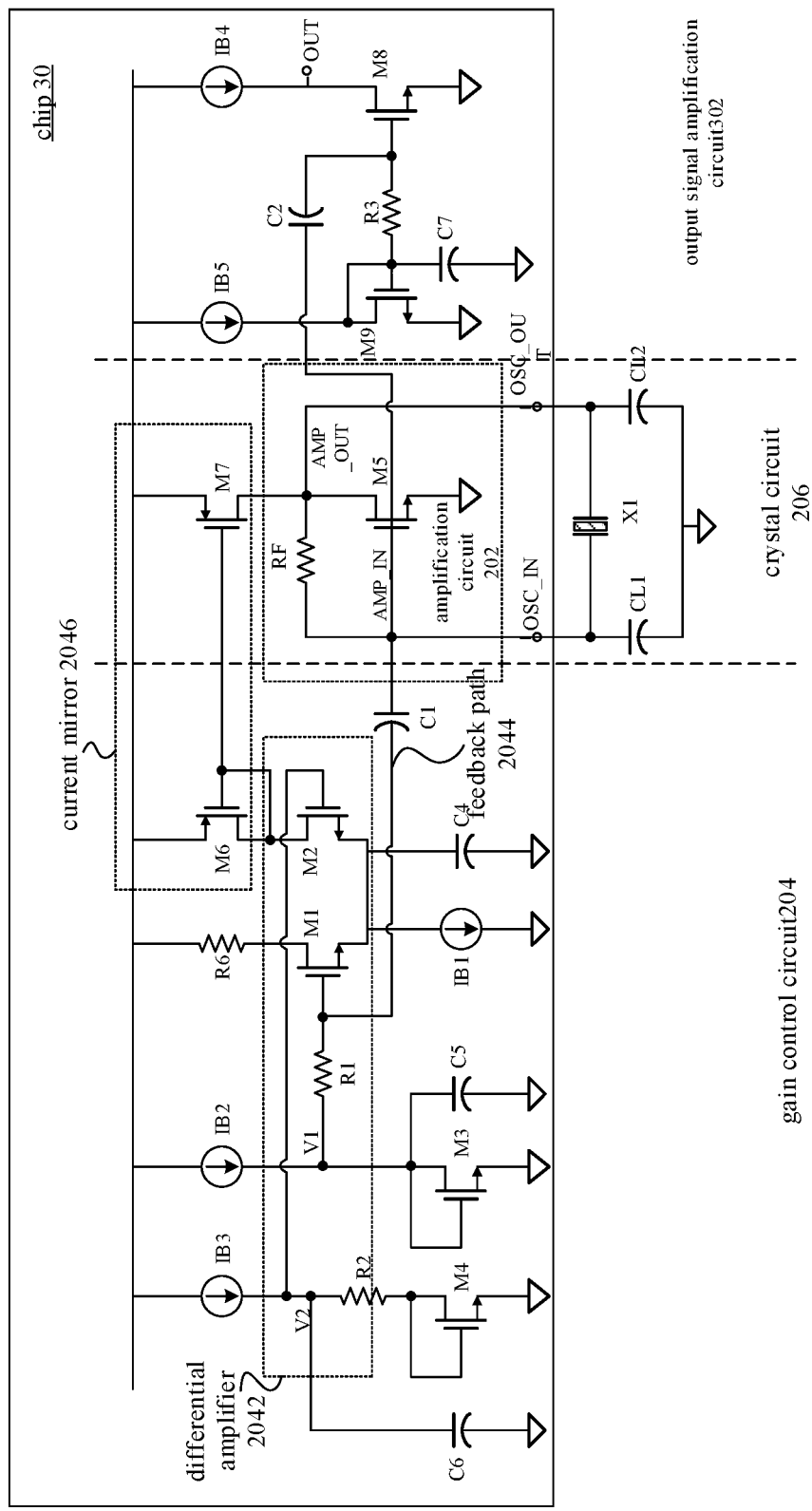
FIG. 2 shows a schematic diagram of another oscillator circuit in an embodiment of the present disclosure.
Figure 3:
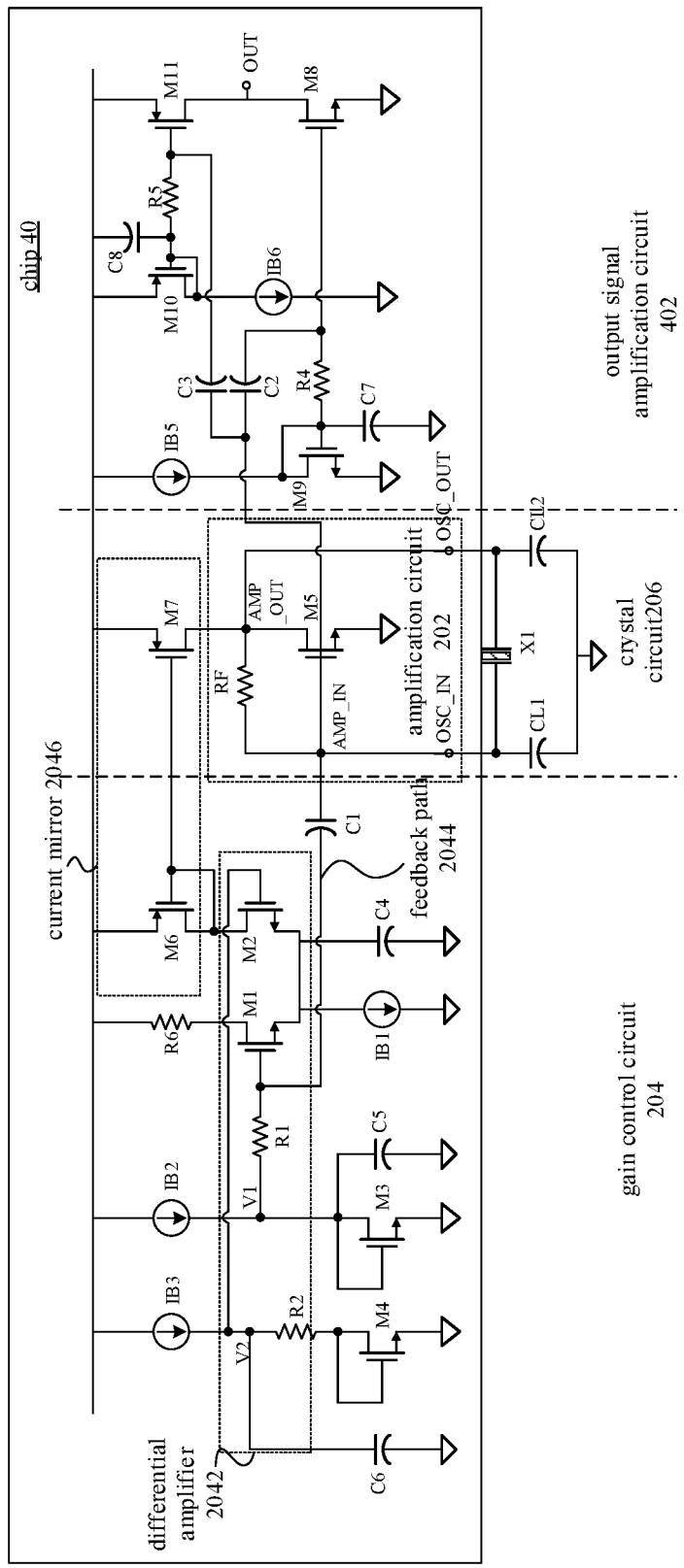
FIG. 3 shows a schematic diagram of yet another oscillator circuit in an embodiment of the present disclosure.
Figure 4:
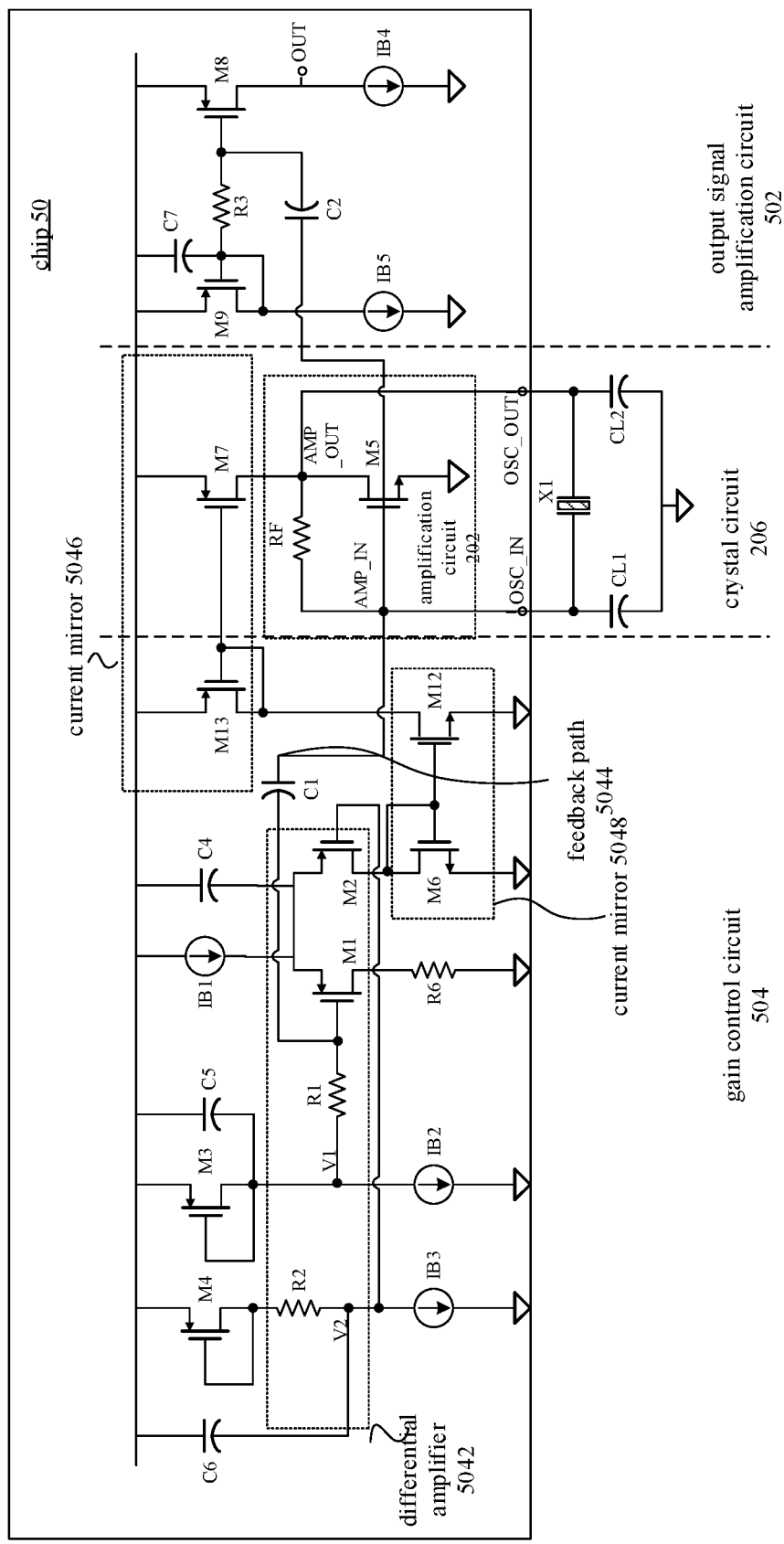
FIG. 4 shows a schematic diagram of still yet another oscillator circuit in an embodiment of the present disclosure.

In some other embodiments, such as embodiments of FIGS. 2 to 4, the feedback path is coupled to the gate of the first transistor M1 and the input end AMP_IN of the amplification circuit 202, OSC_IN, and the crystal oscillator, so as to decect the oscillation amplitude of the input end AMP_IN (i.e., OSC_IN) of the amplification circuit 202, and similarly, the crystal oscillator starts the oscillation and stably enters to the balanced state by the negative feedback adjustment.

A gate of the second transistor M2 is coupled to a second direct current voltage V2.

In some embodiments, the direct current input voltage signals V1 and V2 may be provided by MOS transistors of the same type as a differential input pair. For example, when each is an N-type MOS transistor, the first direct current voltage V1 is less than the second direct current voltage V2 (V1<V2), which may be referred to FIGS. 2 and 3 for specific embodiments.

In some other embodiments, for example, when each of the differential input transistor pair and transistors providing the direct current input voltage signals V1 and V2 is a P-type MOS transistor, the first direct current voltage V1 is greater than the second direct current voltage V2 (V1>V2), which may be referred to FIG. 4 for the specific embodiment.

In some other embodiments, for example, the direct current input voltage signals V1 and V2 may also be generated by dividing voltage through a resistor or by a fixed current flowing through a resistor.

The current mirror 2046 mirrors a current that flows through the second transistor M2 to the amplification circuit 202 as a bias current/an operating direct current of the amplification circuit 202.

In some embodiments, the current mirror 2046 may include a sixth transistor M6 and a seventh transistor M7. A gate and a drain of the sixth transistor M6 are short-circuited to form a diode-connected device, and thus the sixth transistor may act as a small signal resistor. The gate of the sixth transistor M6 is coupled to a gate of the seventh transistor M7, the drain of the sixth transistor M6 is coupled to a drain of the second transistor M2, and a drain of the seventh transistor M7 is coupled to the drain of the fifth transistor M5.

In some embodiments, the gain control circuit 204 may further include a first resistor R1 provided between the first direct current voltage V1 and the gate of the first transistor M1.

In some embodiments, a drain of the first transistor M1 may be coupled to a power supply voltage through a sixth resistor R6.

In some embodiments, a source of the first transistor M1 is coupled to a source of the second transistor M2, and the source of the first transistor M1 and the source of the second transistor M2 may be coupled to ground through a fourth capacitor C4.

Referring to FIG. 1, the first direct current voltage V1 and the second direct current voltage V2 provide two stable direct current voltages. In FIGS. 2 and 3, when the transistors of the differential amplifier are all N-type MOS (NMOS) transistors, the first direct current voltage V1 is less than the second direct current voltage V2 (V1<V2). In FIG. 4, when the transistors of the differential amplifier are all P-type MOS (PMOS) transistors, the first direct current voltage V1 is greater than the second direct current voltage V2 (V1>V2).

In the embodiment of FIG. 1, before the crystal oscillator (crystal circuit 206) starts the oscillation, a tail current of the first current source IB1 completely flows into one of input transistors of the differential amplifier 2042, i.e., the second transistor M2, to provide an operating direct current to the fifth transistor M5 of the amplification circuit 202 through the sixth transistor M6 and the seventh transistor M7 of the current mirror. During the oscillator starts the oscillation, the gain control circuit 204 detects the output end AMP_OUT of the amplification circuit 202 through the coupling of the first capacitor C1, that is, an oscillation amplitude of the drain of the fifth transistor M5 gradually increases. The tail current of the first current source IB1 is gradually shunted by one of input transistors of the differential amplifier 2042, i.e., the first transistor M1, and a current currently flowing through the other input transistor, i.e., the second transistor M2, gradually decreases. The working direct current mirrored to the fifth transistor M5 of the amplification circuit 202 gradually decreases to a level just enough to maintain the oscillation, and finally reaches a balanced state.

Before the crystal oscillator starts the oscillation, the first current source IB1 almost entirely flows through the second transistor M2, and the fifth transistor M5 of the amplification circuit 202 is provided with a relatively large bias current (direct current operation) and a relatively large gain, such that the oscillation of the crystal oscillator X1 may be started quickly.

After the crystal oscillator starts the oscillation, an output of the fifth transistor M5 of the amplification circuit 202 becomes larger, and a gate voltage of the first transistor M1 becomes larger, such that distribution of the first current source IB1 on the first transistor M1 and the second transistor M2 changes, and a current distributed on the second transistor M2 becomes smaller. Through a feedback process, a balanced state is reached, and the bias current of the fifth transistor M5 is stabilized at a predetermined value.

The first capacitor C1 on the feedback path 1044 feeds back an alternating current component of the output end AMP_OUT of the amplification circuit 202, and the first resistor R1 enables an alternating current signal fed back by the first capacitor C1 not to affect the first direct current voltage V1, ensuring that a direct current input signal V1 of the differential input of the differential amplifier 2042 is stable, such that the first resistor may stabilize the first direct current voltage V1 input to the gate of the first transistor M1. The gate of the first transistor M1 is coupled to the input end or the output end of the amplification circuit through the first capacitor C1, and during the crystal oscillator starts the oscillation, the oscillation amplitude of the input end or the output end of the amplifier circuit gradually increases, the current flowing through the first transistor M1 gradually increases and the current flowing through the second transistor M2 gradually decreases, and the direct current mirrored to the amplification circuit gradually decreases until the crystal oscillator reaches a balanced state. The embodiment provides a gain control circuit where a large resistor is connected between the differential input pair and the bias voltage V1 to ensure a stable direct current operating point, the gain control circuit detects the that the capacitor couples the oscillation signal to the differential amplifier input pair, and the negative feedback enables a part of the tail current of the differential amplifier 2042 to be mirrored to the amplification circuit 202, which not only reduces the power consumption of the oscillator, but also ensures a stable output frequency of the oscillator.

FIG. 2 is a schematic diagram of another oscillator circuit shown according to an exemplary embodiment. For example, the oscillator circuit shown in FIG. 2 may be stably placed on a chip 30. The chip 30 may be, for example, a microcontroller unit (MCU), a central processing unit (CPU), a system on chip (SoC) or other chips, and coupled to an off-chip crystal oscillator through a chip pin. Both the crystal oscillator and the chip 30 may be mounted on a printed circuit board (PCB) (not shown in FIG. 2).

The difference between the oscillator circuit shown in FIG. 2 and the oscillator circuit shown in FIG. 1 is that: 1) the oscillator circuit shown in FIG. 2 shows a manner to provide a first direct current voltage V1 and a second direct current voltage V2, the first direct current voltage V1 and the second direct current voltage V2 are provided by MOSs (Metal-Oxide-Semiconductor Field-Effect Transistor, MOSFET, MOS for short) of the same type as the differential input pair, and each of the MOSs is a N-type MOSFET (referred to as a NMOS transistor for short); 2) the oscillator circuit shown in FIG. 2 also includes an output signal amplification circuit 302.

The gate of the first transistor M1 is coupled to the first direct current voltage V1, and the gate of the first transistor M1 is also coupled to the input end AMP_IN of the amplification circuit 202 through a feedback path 2044, so as to detect an oscillation amplitude of the input end AMP_IN of the amplification circuit 202.

Similarly, in other embodiments, the feedback path may also be coupled to the output end AMP_OUT of the amplification circuit 202 to detect an oscillation amplitude of the output end AMP_OUT of the amplification circuit 202.

As shown in FIG. 2, for a part of a circuit providing the first direct current voltage V1 and the second direct current voltage V2, the gain control circuit 204 may also include a third transistor M3, a fourth transistor M4, a second current source IB2, a third current source IB3, a the second resistor R2.

The second current source IB2 and the third transistor M3 are connected in series between a power supply voltage and a ground.

The third current source IB3, the second resistor R2 and the fourth transistor M4 are connected in series between the power supply voltage and the ground.

The third transistor M3 is diode-connected, and a drain of the third transistor M3 is coupled to the gate of the first transistor M1 to provide the differential amplifier 2042 with the first direct current voltage V1.

In some embodiments, the gain control circuit 204 may also include a fifth capacitor C5 coupled between the first direct current voltage V1 and the ground.

In some embodiments, the gain control circuit 204 may also include a first resistor R1, and the drain of the third transistor M3 is coupled to the gate of the first transistor M1 through the first resistor R1.

The fourth transistor M4 is diode-connected, and a drain of the fourth transistor M4 is coupled to the gate of the second transistor M2 through the second resistor R2 to provide the differential amplifier 2042 with the second direct current voltage V2.

In some embodiments, the gain control circuit 204 may also include a sixth capacitor C6 coupled between the second direct current voltage V2 and the ground.

The first transistor M1, the second transistor M2, the third transistor M3 and the fourth transistor M4 are all N-type MOSFETs (referred to as NMOS transistors for short).

The second current source IB2 and the third current source IB3 serve to provide current. Gate-source voltage differences of the third transistor M3 and the fourth transistor M4 may be the same, and currents of the second current source IB2 and the third current source IB3 may also be the same. Thus, the first direct current voltage V1 is equal to the gate-source voltage difference of the third transistor M3, and the second direct current voltage V2 is equal to the gate-source voltage difference of the fourth transistor M4 plus IB3*R2, which ensures that the first direct current voltage V1 is less than the second direct current voltage V2 (V1<V2).

The first direct current voltage V1 and the second direct current voltage V2 are stabilized and filtered by the fifth capacitor C5 and the sixth capacitor C6, respectively, and the fourth capacitor C4 serves to stabilize source voltages of the input transistor pair, i.e., the first transistor M1 and the second transistor M2, of the differential amplifier 2042. The first capacitor C1 provides the feedback path 2044 from the first terminal OSC_IN (the AMP_IN is equivalent to the OSC_IN in the present embodiment) to the gate of the first transistor M1, feeding back an alternating current component coupled to the first terminal OSC_IN of the crystal oscillator. The first resistor R1 plays a role of isolating, such that the alternating current component fed back from the first capacitor C1 does not affect the first direct current voltage V1, thereby further ensuring that the direct current input signal of the differential input pair is stable.

As shown in FIG. 2, for the output signal amplification circuit 302, the output signal amplification circuit 302 may include a second capacitor C2, an eighth transistor M8, and a fourth current source IB4.

The input end AMP_IN of the amplification circuit 202 may be coupled to a first end of the second capacitor C2, a second end of the second capacitor C2 is coupled to a gate of the eighth transistor M8, a drain of the eighth transistor M8 is coupled to the output end OUT of the oscillator circuit, and the eighth transistor M8 serves as an output signal amplifier. The fourth current source IB4 is coupled between the power supply voltage and the output end OUT of the oscillator circuit.

In another embodiment, the output end AMP_OUT of the amplification circuit 202 may be coupled to the first end of the second capacitor C2 of the output signal amplification circuit, and other output signal amplification circuits are the same as those in FIG. 2, which is not described herein.

In some embodiments, the output signal amplification circuit 302 may also include a fifth current source IB5, a ninth transistor M9 and a third resistor R3. The fifth current source IB5 is coupled between a power supply voltage and a drain of the ninth transistor M9. The ninth transistor M9 is diode-connected, and a gate of the ninth transistor M9 is coupled to a gate of the eighth transistor M8 through the third resistor R3. The eighth transistor M8 and the ninth transistor M9 form a first current mirror pair transistor of the output signal amplification circuit 302.

In some embodiments, the output signal amplification circuit 302 may also include a seventh capacitor C7 coupled between the gate of the ninth transistor M9 and the ground.

A current of the fifth current source IB5 pulls down an OUT node through the ninth transistor M9 and the eighth transistor M8, which form the current mirror, and the third resistor R3 and the seventh capacitor C7 paly the role of isolating and stabilizing the voltage, so as to ensure that a direct current input signal of the output signal amplifier, i.e., the eighth transistor M8, is stable, and amplify a small oscillation signal of the AMP_IN, i.e., OSC_IN, coupled through the second capacitor C2. A common-source amplifier formed by the fourth current source IB4 and the eighth transistor M8 is provided with a stable direct current operating point, which may stably output and amplify the small oscillation signal with a full-amplitude.

FIG. 3 is a schematic diagram of yet another oscillator circuit shown according to an exemplary embodiment. For example, the oscillator circuit shown in FIG. 4 may be provided on a chip 40. The chip 40 may be, for example, a microcontroller unit (MCU), a central processing unit (CPU), a system on chip (SoC) or other chips, and coupled to an off-chip crystal oscillator through a chip pin. Both the crystal oscillator and the chip 40 may be mounted on a printed circuit board (PCB) (not shown in FIG. 3).

The difference between the oscillator circuit shown in FIG. 3 and the oscillator circuit shown in FIG. 2 is that an output signal amplification circuit 402 of the oscillator circuit shown in FIG. 3 is different from the output signal amplification circuit 302 of the oscillator circuit shown in FIG. 2.

As shown in FIG. 3, for the output signal amplification circuit 402, the output signal amplification circuit may include a second capacitor C2, an eighth transistor M8, a ninth transistor M9, a fifth current source IB5, a third capacitor C3, a tenth transistor M10, an eleventh transistor M11 and a sixth current source IB6.

The input end AMP_IN of the amplification circuit 202 may be coupled to a gate of the eighth transistor M8 through the second capacitor C2, the fifth current source IB5 is coupled between the power supply voltage and a drain of the ninth transistor M9, the ninth transistor M9 is diode-connected, and a gate of the ninth transistor M9 is coupled to the gate of the eighth transistor M8. The input end AMP_IN of the amplification circuit 202 may be coupled to a gate of the eleventh transistor M11 through the third capacitor C3, the sixth current source IB6 is coupled between a drain of the tenth transistor M10 and the ground, the tenth transistor M10 is diode-connected, and a gate of the tenth transistor M10 is coupled to the gate of the eleventh transistor M11.

In another embodiment, the output end AMP_OUT of the amplification circuit 202 may be coupled to the second capacitor C2 and the third capacitor C3 of the output signal amplification circuit, and other output signal amplification circuits are the same as those in FIG. 3, which is not described herein.

The output signal amplification circuit 402 may also include an eighth capacitor C8 coupled between the power supply voltage and the gate of the tenth transistor M10.

A drain of the eighth transistor M8 and a drain of the eleventh transistor M11 are coupled to the output end OUT of the oscillator circuit, respectively.

The output signal amplification circuit 402 may also include a fourth resistor R4 and a fifth resistor R5.

The gate of the ninth transistor M9 is coupled to the gate of the eighth transistor M8 through the fourth resistor R4. The eighth transistor M8 and the ninth transistor M9 form a first current mirror pair of the output signal amplification circuit 402.

The gate of the tenth transistor M10 is coupled to the gate of the eleventh transistor M11 through the fifth resistor R5. The tenth transistor M10 and the eleventh transistor M11 form a second current mirror pair of the output signal amplification circuit 402.

A current of the fifth current source IB5 pulls down an OUT node through the ninth transistor M9 and the eighth transistor M8, which form the current mirror, and a current of the sixth current source IB6 pulls up the OUT node through the tenth transistor M10 and the eleventh transistor M11, which form the current mirror. The OUT node voltage is any level between the power supply and the ground. The second capacitor C2 and the third capacitor C3 couple a gate signal of the fifth transistor M5 of the amplification circuit 202 to the gates of the eighth transistor M8 and the eleventh transistor M11, to amplify the output in the way of push-pull. The fourth resistor R4 and the fifth resistor R5 play the role of isolating and stabilizing the voltage, so as to stabilize a direct current operating point of the amplifier formed by the eighth transistor M8 and the eleventh transistor M11.

The output signal amplification circuit 402 in FIG. 3 is a common-source amplifier with independent large signal direct current input voltage, which is isolated and stabilized by large resistors R4 and R5, such that the operating point of the output signal amplifier is not affected. A small oscillation signal of the input end AMP_IN of the amplification circuit 202 is coupled to gate input ends of the output signal amplifier M8 and M11 through the capacitors C2 and C3, so as to amplify the output. Compared with the output signal amplification circuit 302 in FIG. 2, it has advantages of reducing power consumption and improving gain.

FIG. 4 is a schematic diagram of still yet another oscillator circuit shown according to an exemplary embodiment. For example, For example, the oscillator circuit shown in FIG. 4 may be provided on a chip 50. The chip 50 may be, for example, a microcontroller unit (MCU), a central processing unit (CPU), a system on chip (SoC) or other chips, and coupled to an off-chip crystal oscillator through a chip pin. Both the crystal oscillator and the chip 50 may be mounted on a printed circuit board (PCB) (not shown in FIG. 4). The difference between FIG. 4 and FIG. 2 is that the oscillator circuit shown in FIG. 4 shows a manner to provide the first direct current voltage V1 and the second direct current voltage V2: the first direct current voltage V1 and the second direct current voltage V2 are provided by MOS transistors of the same type as the differential input pair, and each of the MOS transistors is a P-type MOSFET (referred to as a PMOS transistor for short). When the circuit is connected, the power supply voltage in FIG. 2 may be interchanged with the ground.

The oscillator circuit shown in FIG. 4 may include: a first terminal OSC_IN, a second terminal OSC_OUT, an amplification circuit 202, a gain control circuit 504 and an output signal amplification circuit 502.

The gain control circuit 504 is coupled to the amplification circuit 202. The gain control circuit 504 may include a differential amplifier 5042, a first current source IB1, a feedback path 5044, a current mirror 5046, and a current mirror 5048.

The differential amplifier 5042 may include a first transistor M1 and a second transistor M2, and a source of the first transistor M1 and a source of the second transistor M2 are coupled to the first current source IB1. The first transistor M1 and the second transistor M2 may be PMOS transistors.

A gate of the first transistor M1 is coupled to the first direct current voltage V1, and the gate of the first transistor M1 is also coupled to an input end AMP_IN of the amplification circuit 202 through the feedback path 5044 to detect an oscillation amplitude of the input end AMP_IN of the amplification circuit 202.

Similarly, as described above, in other embodiments, the feedback path may also be coupled to an output end AMP_OUT of the amplification circuit 202 to detect an oscillation amplitude of the output end AMP_OUT of the amplification circuit 202.

The third transistor M3 is a P-type MOSFET and is diode-connected to provide the first transistor M1 with a direct current bias voltage V1. The fourth transistor M4 is a P-type MOSFET and is diode-connected. A drain of the fourth transistor M4 is coupled to a gate of the second transistor M2 through the second resistor R2 to provide the second transistor M2 with a direct current bias voltage V2. The arrangement of the second resistor R2 ensures that the first direct current voltage V1 is greater than the second direct current voltage V2 (V1>V2)

The current mirror 5046 may include a thirteenth transistor M13 and a seventh transistor M7, the thirteenth transistor M13 may be diode-connected, the current mirror 5048 may include a twelfth transistor M12 and a sixth transistor M6, the sixth transistor M6 may be diode-connected, a gate of the thirteenth transistor M13 is coupled with a gate of the seventh transistor M7, a gate of the sixth transistor M6 is coupled with a gate of the twelfth transistor M12, a drain of the sixth transistor M6 is coupled to a drain of the second transistor M2, a drain of the twelfth transistor M12 is coupled to a drain of the thirteenth transistor M13, and a drain of the seventh transistor M7 is coupled to a drain of the fifth transistor M5.

The P-type MOSFET M1 and M2 serve as operational amplifier input pair transistor of the differential amplifier 5042. A part of or all of a current of the first current source IB1 flows through the M2 input transistor, and is mirrored to the fifth transistor M5 through the current mirrors 5046 and 5048, and the negative feedback adjusts the direct current operating point of the oscillator.

The output signal amplification circuit 502 may include a fourth current source IB4, a P-type MOSFET eighth transistor M8, and a second capacitor C2. A source of the eighth transistor M8 is coupled to the power supply voltage, a drain of the eighth transistor M8 is coupled to an output end OUT of the oscillator circuit, and the fourth current source IB4 is coupled between the output end OUT of the oscillator circuit and the ground. A first end of the second capacitor C2 is coupled to the input end AMP_IN of the amplification circuit 202, a second end of the second capacitor C2 is coupled to a gate of the eighth transistor M8. An output signal is coupled to the gate of the eighth transistor M8 through the second capacitor C2 and amplified to the OUT output.

In some embodiments, the output signal amplification circuit 502 may also include a fifth current source IB5, a P-type MOSFET ninth transistor M9, and a third resistor R3. A source of the ninth transistor M9 is coupled to the power supply voltage, a drain of the ninth transistor M9 is coupled to the fifth current source IB5, and the fifth current source IB5 is coupled between the drain of the ninth transistor M9 and the ground. The ninth transistor M9 is diode-connected, and a gate of the ninth transistor M9 is coupled to the gate of the eighth transistor M8 through the third resistor R3.

In some embodiments, the output signal amplification circuit 502 may also include a seventh capacitor C7 coupled between the power supply voltage and the gate of the ninth transistor M9.

A current of the fifth current source IB5 pulls up the OUT node through the ninth transistor M9 and the eighth transistor M8, which form the current mirror. The third resistor R3 and the seventh capacitor C7 play the role of isolating and stabilizing voltage, so as to ensure that a direct current input signal of the output signal amplifier, i.e., the eighth transistor M8, is stable, and amplify a small oscillation signal of the AMP_IN, i.e., OSC_IN, coupled through the second capacitor C2. A common-source amplifier formed by the fourth current source IB4 and the eighth transistor M8 is provided with a stable direct current operating point, which may stably output and amplify the small oscillation signal with a full-amplitude.

In some embodiments, the first end of the second capacitor C2 is coupled to the output end AMP_OUT of the amplification circuit 202, and other output signal amplification circuits are the same as those described above, which is not described herein.

The output signal amplification circuit 502 in the present embodiment may also be the output signal amplification circuit 302 in the embodiment of FIG. 2, the output signal amplification circuit 402 in the embodiment of FIG. 3, or other signal amplification circuits.

The output signal amplification circuit proposed in the embodiments of the present disclosure is provided an independent large signal direct current input voltage, ensures the direct current operating point to be stable through the large resistor isolation, the direct current operating point of the output signal amplifier is fixed, and the oscillation signal is coupled to the input end of the output signal amplifier through one or two capacitors to amplify the output. If the tail current of the output signal amplifier is fixed as in the related art, the direct current input voltage of the output signal amplifier decreases as the oscillator starts the oscillation, resulting in mismatch between the amplifier transistor and the tail current, and eventually, the amplifier is turned off due to the small input voltage, leading to the signal not being amplified and output. If the tail current of the output signal amplifier and the tail current of the oscillator are mirror as in the related art, in the process from the starting of the oscillation to the balanced state, the direct current of the oscillator decreases or even there is no the direct current of the oscillator, the operating current of the output signal amplifier may also small or there is even no operating current of the output signal amplifier, such that the oscillation signal of the input end of the oscillator cannot be amplified.

As another aspect, the present disclosure also provides a chip, including the oscillator circuit of any one of the above embodiments. Specific implementations may be referred to the chip 20, chip 30, chip 40 and chip 50 in FIGS. 1 to 4.

As another aspect, the present disclosure also provides an electronic device, including the chip of any one of the above embodiments and the crystal circuit. The crystal circuit includes a crystal oscillator X1, a first load capacitor CL1 and a second load capacitor CL2. The specific implementations may be referred to FIGS. 2 to 4.

According to an aspect of the present disclosure, an oscillator circuit is provided and includes: a first terminal and a second terminal; an amplification circuit with an input end coupled to a first end of a crystal circuit through the first terminal and an output end coupled to a second end of the crystal circuit through the second terminal; a gain control circuit coupled to the amplification circuit and including a differential amplifier, a first current source, a feedback path and a current mirror, wherein: the differential amplifier includes a first transistor and a second transistor, a source of the first transistor and a source of the second transistor are coupled to the first current source; a gate of the first transistor is coupled to a first direct current voltage, and the gate of the first transistor is coupled to the input end or the output end of the amplification circuit through the feedback path; a gate of the second transistor is coupled to a second direct current voltage; the current mirror mirrors a current flowing through the second transistor to the amplification circuit.

According to an embodiment of the present disclosure, the gain control circuit further includes a first resistor provided between the first direct current voltage and the gate of the first transistor.

According to an embodiment of the present disclosure, the gain control circuit further includes a third transistor, a fourth transistor, a second current source, a third current source and a second resistor, wherein: the second current source and the third transistor are connected in series between a power supply voltage and a ground; the third current source, the second resistor and the fourth transistor are connected in series between the power supply voltage and the ground; the third transistor is diode-connected to provide the first direct current voltage to the differential amplifier; the fourth transistor is diode-connected to provide the second direct current voltage to the differential amplifier.

According to an embodiment of the present disclosure, a drain of the third transistor is coupled to the gate of the first transistor through the first resistor, and a drain of the fourth transistor is coupled to the gate of the second transistor through the second resistor.

According to an embodiment of the present disclosure, when each of the first transistor, the second transistor, the third transistor and the fourth transistor is an NMOS transistor, the first direct current voltage is less than the second direct current voltage.

According to an embodiment of the present disclosure, when each of the first transistor, the second transistor, the third transistor and the fourth transistor is a PMOS transistor, the first direct current voltage is greater than the second direct current voltage.

According to an embodiment of the present disclosure, wherein the feedback path includes a first capacitor.

According to an embodiment of the present disclosure, the amplification circuit includes a fifth transistor, a gate of the fifth transistor serves as the input end of the amplification circuit, and a drain of the fifth transistor serves as the output end of the amplification circuit.

According to an embodiment of the present disclosure, the current mirror includes a sixth transistor and a seventh transistor, the sixth transistor is diode-connected, a gate of the sixth transistor is coupled with a gate of the seventh transistor, a drain of the sixth transistor is coupled with a drain of the second transistor, and a drain of the seventh transistor is coupled with a drain of the fifth transistor.

According to an embodiment of the present disclosure, the oscillator circuit further includes an output signal amplification circuit, wherein the output signal amplification circuit includes a second capacitor, an eighth transistor and a fourth current source, wherein: the input end or the output end of the amplification circuit is coupled to a first end of the second capacitor, a second end of the second capacitor is coupled to a gate of the eighth transistor, and a drain of the eighth transistor is coupled to an output end of the oscillator circuit and the fourth current source.

According to an embodiment of the present disclosure, the output signal amplification circuit further includes a fifth current source, a ninth transistor and a third resistor, wherein: the fifth current source is coupled to a drain of the ninth transistor, the ninth transistor is diode-connected, and a gate of the ninth transistor is coupled to the gate of the eighth transistor through the third resistor.

According to an embodiment of the present disclosure, the oscillator circuit further includes an output signal amplification circuit, wherein the output signal amplification circuit includes a second capacitor, an eighth transistor, a third capacitor and an eleventh transistor, wherein: the input end or the output end of the amplification circuit is coupled to a gate of the eighth transistor through the second capacitor; the input end or the output end of the amplification circuit is coupled to a gate of the eleventh transistor through the third capacitor; a drain of the eighth transistor and a drain of the eleventh transistor are coupled to an output end of the oscillator circuit, respectively.

According to an embodiment of the present disclosure, the output signal amplification circuit further includes a ninth transistor, a fifth current source, a fourth resistor, a tenth transistor, a sixth current source and a fifth resistor; the ninth transistor is diode-connected, the fifth current source is coupled to a drain of the ninth transistor, and a gate of the ninth transistor is coupled to the gate of the eighth transistor through the fourth resistor; the tenth transistor is diode-connected, the sixth current source is coupled to a drain of the tenth transistor, and a gate of the tenth transistor is coupled to the gate of the eleventh transistor through the fifth resistor.

According to an embodiment of the present disclosure, the oscillator circuit further includes a feedback resistor provided between the first terminal and the second terminal.

According to an embodiment of the present disclosure, the first transistor and the second transistor are NMOS transistors, and the first direct current voltage is less than the second direct current voltage.

According to an embodiment of the present disclosure, the first transistor and the second transistor are PMOS transistors, and the first direct current voltage is greater than the second direct current voltage.

According to another aspect of the present disclosure, an oscillator circuit is provided and includes: an amplification circuit, wherein an input end of the amplification circuit is coupled to a first end of an external crystal oscillator, and an output end of the amplification circuit is coupled to a second end of the external crystal oscillator; a differential amplifier, wherein the differential amplifier includes a first transistor and a second transistor, and the first transistor and the second transistor form a input pair transistor of the differential amplifier; a current mirror, wherein the current mirror includes a sixth transistor and a seventh transistor, the sixth transistor and the seventh transistor form a pair transistor of the current mirror, the sixth transistor is connected to the second transistor, the seventh transistor is connected to the output end of the amplification circuit, and the current mirror is configured to mirror a current flowing through the second transistor to the amplification circuit; wherein a gate of the first transistor is coupled to the input end or the output end of the amplification circuit through the first capacitor, during the external crystal oscillator starts oscillation, an oscillation amplitude of the input end or the output end of the amplification circuit increases gradually, a current flowing through the first transistor increases gradually, and a current flowing through the second transistor decreases gradually, a direct current mirrored to the amplification circuit decreases gradually until the crystal oscillator reaches a balanced state.

According to an embodiment of the present disclosure, the oscillator circuit further includes a first resistor connected to the gate of the first transistor and configured to stabilize a first direct current voltage input to the gate of the first transistor.

According to an embodiment of the present disclosure, a second direct current voltage is input to a gate of the second transistor, and when each input pair transistor of the differential amplifier is an NMOS transistor, the first direct current voltage is less than the second direct current voltage.

According to an embodiment of the present disclosure, a second direct current voltage is input to a gate of the second transistor, and when each the input pair transistor of the differential amplifier is a PMOS transistor, the first direct current voltage is greater than the second direct current voltage.

According to an embodiment of the present disclosure, the oscillator circuit further includes an output signal amplification circuit coupled to the input end or the output end of the amplification circuit.

According to an embodiment of the present disclosure, the output signal amplification circuit includes a first current mirror pair transistor, and the first current mirror pair transistor includes an eighth transistor and a ninth transistor.

According to an embodiment of the present disclosure, the output signal amplification circuit further includes a second current mirror pair transistor, and the second current mirror pair transistor include a tenth transistor and an eleventh transistor.

According to another aspect of the present disclosure, a chip is provided and includes the any one of above oscillator circuit.

According to another aspect of the present disclosure, an electronic device is provided, including the above chip and the crystal circuit, wherein the crystal circuit includes a crystal oscillator, a first load capacitor and a second load capacitor.

The oscillator circuit provided in the embodiments of the present disclosure, detects an oscillation amplitude of an input end or an output end of an amplification circuit through a gain control circuit, adjusts an operating current of the amplification circuit by a negative feedback, and limits the oscillation amplitude of the input end of the amplification circuit, so as to maintain the oscillation amplitude at a level of just oscillation, while a fixed oscillation amplitude reduces an influence of nonlinearity of the amplification circuit on a frequency, thus ensuring a stable switching of an operating point of a crystal circuit and a stable output frequency.

The exemplary embodiments of the present disclosure have been specifically shown and described above. It should be understood that the present disclosure is not limited to the detailed structure, arrangement, or implementation method, described herein. On the contrary, the present disclosure intends to cover various modifications and equivalent arrangements included in the spirit and scope of the appended claims.

What is claimed is:

1. An oscillator circuit, comprising:
a first terminal and a second terminal;
an amplification circuit with an input end coupled to a first end of a crystal circuit through the first terminal and an output end coupled to a second end of the crystal circuit through the second terminal; and
a gain control circuit coupled to the amplification circuit and comprising a differential amplifier, a first current source, a feedback path and a current mirror, wherein:
the differential amplifier comprises a first transistor and a second transistor, a source of the first transistor and a source of the second transistor are coupled to the first current source;
a gate of the first transistor is coupled to a first direct current voltage, and the gate of the first transistor is coupled to the input end or the output end of the amplification circuit through the feedback path;
a gate of the second transistor is coupled to a second direct current voltage;
the current mirror mirrors a first current flowing through the second transistor to the amplification circuit; and
wherein during the oscillator circuit starting oscillation, a second current flowing through the first transistor increases gradually, the first current flowing through the second transistor decreases gradually, and a third current mirrored to the amplification circuit decreases gradually until the oscillator circuit reaches a balanced state.

2. The oscillator circuit according to claim 1, wherein the gain control circuit further comprises a first resistor provided between the first direct current voltage and the gate of the first transistor.

3. The oscillator circuit according to claim 2, wherein the gain control circuit further comprises a third transistor, a fourth transistor, a second current source, a third current source, and a second resistor, wherein:
the second current source and the third transistor are connected in series between a power supply voltage and a ground;
the third current source, the second resistor and the fourth transistor are connected in series between the power supply voltage and the ground;
the third transistor is diode-connected to provide the first direct current voltage to the differential amplifier; and
the fourth transistor is diode-connected to provide the second direct current voltage to the differential amplifier.

4. The oscillator circuit according to claim 3, wherein a drain of the third transistor is coupled to the gate of the first transistor through the first resistor, and a drain of the fourth transistor is coupled to the gate of the second transistor through the second resistor.

5. The oscillator circuit according to claim 3, wherein when each of the first transistor, the second transistor, the third transistor, and the fourth transistor is an NMOS transistor, the first direct current voltage is less than the second direct current voltage.

6. The oscillator circuit according to claim 3, wherein when each of the first transistor, the second transistor, the third transistor, and the fourth transistor is a PMOS transistor, the first direct current voltage is greater than the second direct current voltage.

7. The oscillator circuit according to claim 1, wherein the feedback path comprises a first capacitor.

8. The oscillator circuit according to claim 1, wherein the amplification circuit comprises a fifth transistor, a gate of the fifth transistor serves as the input end of the amplification circuit, and a drain of the fifth transistor serves as the output end of the amplification circuit.

9. The oscillator circuit according to claim 8, wherein the current mirror comprises a sixth transistor and a seventh transistor, the sixth transistor is diode-connected, a gate of the sixth transistor is coupled with a gate of the seventh transistor, a drain of the sixth transistor is coupled with a drain of the second transistor, and a drain of the seventh transistor is coupled with a drain of the fifth transistor.

10. The oscillator circuit according to claim 1, further comprising an output signal amplification circuit, wherein the output signal amplification circuit comprises a second capacitor, an eighth transistor, and a fourth current source, wherein:
the input end or the output end of the amplification circuit is coupled to a first end of the second capacitor, a second end of the second capacitor is coupled to a gate of the eighth transistor, and a drain of the eighth transistor is coupled to an output end of the oscillator circuit and the fourth current source; and
wherein the output signal amplification circuit further comprises a fifth current source, a ninth transistor, and a third resistor, wherein:
the fifth current source is coupled to a drain of the ninth transistor, the ninth transistor is diode-connected, and a gate of the ninth transistor is coupled to the gate of the eighth transistor through the third resistor.

11. The oscillator circuit according to claim 1, further comprising an output signal amplification circuit, wherein the output signal amplification circuit comprises a second capacitor, an eighth transistor, a third capacitor, and an eleventh transistor, wherein:
the input end or the output end of the amplification circuit is coupled to a gate of the eighth transistor through the second capacitor;
the input end or the output end of the amplification circuit is coupled to a gate of the eleventh transistor through the third capacitor; and
a drain of the eighth transistor and a drain of the eleventh transistor are coupled to an output end of the oscillator circuit, respectively.

12. The oscillator circuit according to claim 11, wherein the output signal amplification circuit further comprises a ninth transistor, a fifth current source, a fourth resistor, a tenth transistor, a sixth current source, and a fifth resistor;
the ninth transistor is diode-connected, the fifth current source is coupled to a drain of the ninth transistor, and a gate of the ninth transistor is coupled to the gate of the eighth transistor through the fourth resistor; and
the tenth transistor is diode-connected, the sixth current source is coupled to a drain of the tenth transistor, and a gate of the tenth transistor is coupled to the gate of the eleventh transistor through the fifth resistor.

13. The oscillator circuit according to claim 1, further comprising a feedback resistor provided between the first terminal and the second terminal.

14. The oscillator circuit according to claim 1, wherein the first transistor and the second transistor are NMOS transistors, and the first direct current voltage is less than the second direct current voltage; or the first transistor and the second transistor are PMOS transistors, and the first direct current voltage is greater than the second direct current voltage.

15. An oscillator circuit, comprising:
an amplification circuit, wherein an input end of the amplification circuit is coupled to a first end of an external crystal oscillator, and an output end of the amplification circuit is coupled to a second end of the external crystal oscillator;
a differential amplifier, wherein the differential amplifier comprises a first transistor and a second transistor, and the first transistor and the second transistor form an input pair transistor of the differential amplifier;
a current mirror, wherein the current mirror comprises a sixth transistor and a seventh transistor, the sixth transistor and the seventh transistor form a pair transistor of the current mirror, the sixth transistor is connected to the second transistor of the differential amplifier, the seventh transistor is connected to the output end of the amplification circuit, and the current mirror is configured to mirror a first current flowing through the second transistor to the amplification circuit;
wherein a gate of the first transistor is coupled to the input end or the output end of the amplification circuit through a first capacitor; and
wherein during the external crystal oscillator starting oscillation, an oscillation amplitude of the input end or the output end of the amplification circuit increases gradually, a second current flowing through the first transistor increases gradually, the first current flowing through the second transistor decreases gradually, and a third current mirrored to the amplification circuit decreases gradually until the external crystal oscillator reaches a balanced state.

16. The oscillator circuit according to claim 15, further comprising a first resistor connected to the gate of the first transistor and configured to stabilize a first direct current voltage input to the gate of the first transistor.

17. The oscillator circuit according to claim 16, wherein a second direct current voltage is input to a gate of the second transistor, and when each input pair transistor of the differential amplifier is an NMOS transistor, the first direct current voltage is less than the second direct current voltage.

18. The oscillator circuit according to claim 16, wherein a second direct current voltage is input to a gate of the second transistor, and when each the input pair transistor of the differential amplifier is a PMOS transistor, the first direct current voltage is greater than the second direct current voltage.

19. The oscillator circuit according to claim 15, further comprising an output signal amplification circuit coupled to the input end or the output end of the amplification circuit.

20. A chip comprising an oscillator circuit and the oscillator circuit comprises:
a first terminal and a second terminal;
an amplification circuit with an input end coupled to a first end of a crystal circuit through the first terminal and an output end coupled to a second end of the crystal circuit through the second terminal; and
a gain control circuit coupled to the amplification circuit and comprising a differential amplifier, a first current source, a feedback path and a current mirror, wherein:
the differential amplifier comprises a first transistor and a second transistor, a source of the first transistor and a source of the second transistor are coupled to the first current source;
a gate of the first transistor is coupled to a first direct current voltage, and the gate of the first transistor is coupled to the input end or the output end of the amplification circuit through the feedback path;
a gate of the second transistor is coupled to a second direct current voltage;
the current mirror mirrors a first current flowing through the second transistor to the amplification circuit; and
wherein during the oscillator circuit starting oscillation, a second current flowing through the first transistor increases gradually, the first current flowing through the second transistor decreases gradually, and a third current mirrored to the amplification circuit decreases gradually until the oscillator circuit reaches a balanced state.

* * * * *